US009239612B2

United States Patent
Takahashi et al.

(10) Patent No.: US 9,239,612 B2
(45) Date of Patent: Jan. 19, 2016

(54) FIRST POWER-ON RESET CIRCUIT WITH HIGHER POWER CONSUMPTION THAN A SECOND POWER-ON RESET CIRCUIT

(75) Inventors: Masaru Takahashi, Kawasaki (JP); Hiromichi Ishikura, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 266 days.

(21) Appl. No.: 13/816,477

(22) PCT Filed: Aug. 25, 2010

(86) PCT No.: PCT/JP2010/064363
§ 371 (c)(1),
(2), (4) Date: Feb. 11, 2013

(87) PCT Pub. No.: WO2012/026002
PCT Pub. Date: Mar. 1, 2012

(65) Prior Publication Data
US 2013/0145193 A1 Jun. 6, 2013

(51) Int. Cl.
*G06F 1/32* (2006.01)
*G06F 1/24* (2006.01)
*H03K 17/22* (2006.01)
*H03K 17/24* (2006.01)
*G06F 1/26* (2006.01)

(52) U.S. Cl.
CPC ............... *G06F 1/3296* (2013.01); *G06F 1/24* (2013.01); *G06F 1/26* (2013.01); *G06F 1/3234* (2013.01); *H03K 17/22* (2013.01); *H03K 17/24* (2013.01); *H03K 2217/0081* (2013.01); *Y02B 60/32* (2013.01)

(58) Field of Classification Search
USPC ................................ 713/330, 323; 714/22, 23
See application file for complete search history.

(56) References Cited

U.S. PATENT DOCUMENTS

| 6,629,265 | B1 * | 9/2003 | Williams ........................ 714/23 |
| 2001/0001261 | A1 * | 5/2001 | Sugamoto et al. ............ 365/203 |
| 2001/0028263 | A1 * | 10/2001 | Ohbayashi et al. ............ 327/143 |
| 2005/0012531 | A1 * | 1/2005 | Kinugasa et al. ............. 327/143 |
| 2006/0028253 | A1 * | 2/2006 | Sekino et al. ................. 327/143 |
| 2006/0109036 | A1 * | 5/2006 | Hsu .............................. 327/143 |
| 2007/0205815 | A1 * | 9/2007 | Kutz et al. .................... 327/143 |

(Continued)

FOREIGN PATENT DOCUMENTS

| JP | 2008-040543 A | 2/2008 |
| JP | 2008-040559 A | 2/2008 |
| JP | 2009-302810 A | 12/2009 |

(Continued)

OTHER PUBLICATIONS

International Search Report in PCT/JP2010/064363 dated Nov. 22, 2010(English Translation Thereof).

*Primary Examiner* — Vincent Tran
(74) *Attorney, Agent, or Firm* — McGinn IP Law Group, PLLC (57) ABSTRACT

A data processing device includes: a first power-on reset circuit; a second power-on reset circuit with higher power consumption and higher reset voltage accuracy than the first power-on reset circuit; a storage unit storing information for determining whether to keep the second power-on reset circuit in an active state or an inactive state; and a central processing unit initialized in response to respective outputs of the first and second power-on reset circuits and setting the information in the storage unit.

19 Claims, 6 Drawing Sheets

(56) References Cited

U.S. PATENT DOCUMENTS

2008/0034242 A1 2/2008 Ishikura et al.
2008/0158220 A1* 7/2008 Huang et al. .................. 345/213
2010/0156479 A1 6/2010 Matsubara et al.
2010/0275048 A1 10/2010 Ishikura et al.

FOREIGN PATENT DOCUMENTS

JP 2010-147979 A 7/2010

* cited by examiner

FIRST POWER-ON RESET CIRCUIT WITH HIGHER POWER CONSUMPTION THAN A SECOND POWER-ON RESET CIRCUIT

TECHNICAL FIELD

The present invention relates to a data processing device, and particularly to a data processing device having a central processing unit and to a data processing system in which the data processing device is used.

BACKGROUND ART

The electricity meter is one of the devices that have conventionally been passively controlled but recently been required to perform active control using a data processing device including a central processing unit (CPU).

In the conventional electricity meter, the data processing device has been required to perform the function of measuring and recording the consumed amount of electric power generated by a power company and supplied through a power grid to each house, as well as the function of transmitting to the power company the recorded amount of power consumption through a predetermined communication line.

As for the electricity meter used for next-generation power grids, the data processing device is required not only to perform processing for measuring the amount of electric power distributed from the power company but also to perform processing such as processing for conducting reverse-power-flow control under which electric power from a power generation system such as photovoltaic cell or from a power storage system installed in each house is fed back to the power grid, as well as processing for offsetting the amount of distributed electric power and the amount of electric power fed back to the power grid.

Even a system like the electricity meter is required to reduce as much as possible the electric power consumed by the electricity meter itself. Regarding the data processing device performing the processing as described above, the period during which the data processing device is in the standby state is relatively longer than the period during which the data processing device is performing processing. It is therefore necessary to reduce not only the power consumption of the period during which the data processing device is performing processing but also the power consumption of the period during which the data processing device is in the standby state.

In order to minimize the power consumption of the data processing device in the standby state, the data processing device in the standby state is switched to a low power consumption state. For achieving this low power consumption state, it is necessary not only to stop supply of electric power to functional units including the central processing unit (CPU) and stop an oscillator which generates an operation clock in the data processing device, but also to reduce the power consumption of a power supply circuit itself in the data processing device.

CITATION LIST

Patent Literature

PTL 1: Japanese Patent Laying-Open No. 2008-040559
PTL 2: Japanese Patent Laying-Open No. 2008-040543

SUMMARY OF INVENTION

Technical Problem

Some of the data processing devices as described above have a Power-On Reset (POR) circuit for detecting a change of an externally supplied power supply voltage, from a voltage level immediately after the power supply voltage is fed, to an operating voltage level and then perform a power-on reset operation in the data processing device. The POR circuit compares the externally supplied power supply voltage with a reference voltage. When the POR circuit detects that the externally supplied power supply voltage has increased to a predetermined voltage level, the POR circuit outputs a reset signal into the data processing device to thereby cause other circuits including the central processing unit (CPU) to be initialized.

The data processing devices also have an LVD (Low Voltage Detect) circuit. When the LVD circuit detects that the externally supplied power supply voltage, on the contrary, has decreased to a predetermined voltage level, the LVD circuit issues, to the central processing unit (CPU), an interrupt signal or reset signal representing the decrease of the voltage, to thereby cause the central processing unit (CPU) to perform an appropriate operation for the decrease of the voltage or to be initialized.

These POR circuit and LVD circuit include a reference voltage generation circuit which uses a BGR (Band Gap Reference) circuit causing a certain amount of steady-state current to flow. The steady-state current is a part of the current consumed by the data processing device in the low power consumption state.

An object of the present invention is to provide a data processing device and a data processing system capable of reducing the current consumption in the standby state.

Solution to Problem

In summary, the present invention is a data processing device including: a first power-on reset circuit; a second power-on reset circuit with higher power consumption and higher reset voltage accuracy than the first power-on reset circuit; a storage unit storing information for determining whether to keep the second power-on reset circuit in an active state or an inactive state; and a central processing unit initialized in response to respective outputs of the first and second power-on reset circuits and setting the information in the storage unit.

In another aspect, the present invention is a data processing system including a printed circuit board and a data processing device mounted on the printed circuit board. The data processing device includes: a first power-on reset circuit; a second power-on reset circuit with higher power consumption and higher reset voltage accuracy than the first power-on reset circuit; a storage unit storing information for determining whether to keep the second power-on reset circuit in an active state or an inactive state; and a central processing unit initialized in response to respective outputs of the first and second power-on reset circuits and setting the information in the storage unit.

Advantageous Effects of Invention

In accordance with the present invention, the current consumption of the data processing device and the data processing system in the standby state can be reduced.

DESCRIPTION OF EMBODIMENTS

An embodiment of the present invention will hereinafter be described in detail with reference to the drawings. In the drawings, the same or corresponding components are denoted by the same reference characters, and a description thereof will not be repeated.

Regarding the present embodiment, a description will be given of an example where a first reset signal generation circuit with relatively low power consumption and relatively low detection-voltage accuracy, and a second reset signal generation circuit with relatively high power consumption and relatively high detection-voltage accuracy are provided, and a user can select one of the first reset signal generation circuit and the second reset signal generation circuit to use.

Figure 1:
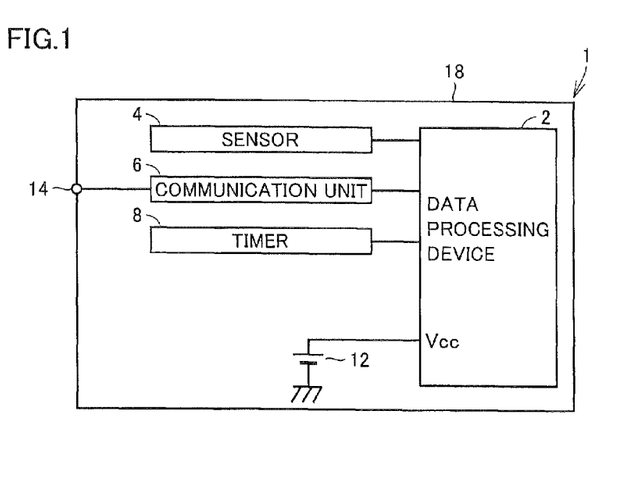
FIG. 1 is a diagram showing an example of the data processing system having the data processing device.

FIG. 1 is a diagram showing an example of the data processing system having the data processing device.

Referring to FIG. 1, a data processing system 1 includes a printed circuit board 18, as well as a data processing device 2, a sensor 4, a communication unit 6, a timer 8, and a battery 12 that are mounted on printed circuit board 18. To data processing device 2, the voltage of battery 12 is supplied as power supply voltage Vcc.

Figure 2:
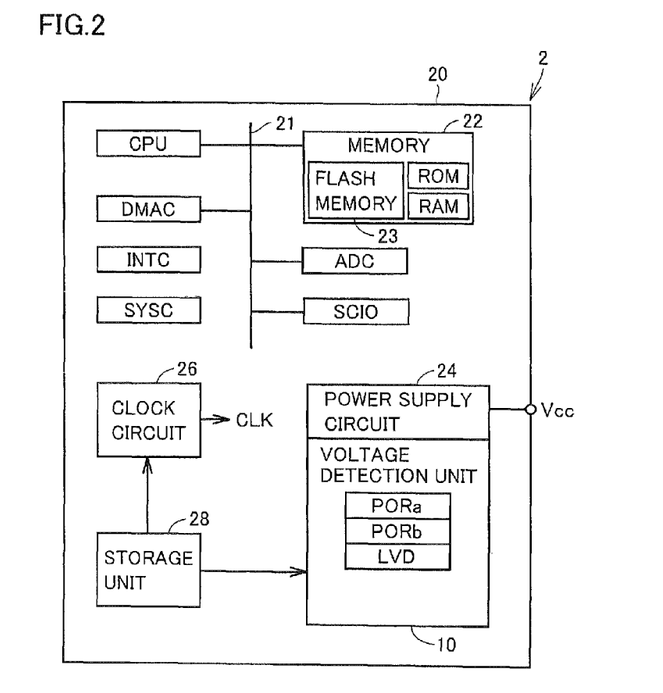
FIG. 2 is a schematic configuration diagram of the data processing device having a central processing unit (CPU).

FIG. 2 is a schematic configuration diagram of the data processing device having a central processing unit (CPU). FIG. 2 shows, in addition to components of a common microcomputer, functional units specific to the present invention.

Referring to FIG. 2, data processing device 2 includes a central processing unit CPU, a memory 22, a bus 21 transferring data and addresses, a data transfer unit (Direct Memory Access Controller) DMAC, an analog-to-digital conversion unit ADC, an interrupt controller INTC, a serial communication unit SCIO, a system control unit SYSC, a clock circuit 26, a power supply circuit 24, and a storage unit 28.

Central processing unit CPU successively executes programs stored in memory 22 and controls the operation of data processing device 2 as a whole. Serial communication unit SCIO stores externally input data in memory 22. Analog-to-digital conversion unit ADC converts an externally input analog signal to a digital value and stores the digital value in memory 22. Data transfer unit DMAC controls data transfer through bus 21, when serial communication unit SCIO or analog-to-digital conversion unit ADC stores digital data in memory 22.

Interrupt controller INTC receives an interrupt signal issued by an external or internal functional unit, and causes interruption to central processing unit CPU. Central processing unit CPU performs processing in accordance with the type of interruption. Clock circuit 26 generates operation clock CLK for data processing device 2 and supplies, to each functional unit in data processing device 2, the operation clock of a frequency appropriate for the functional unit.

Referring to FIGS. 1 and 2, sensor 4 generates an analog signal to be input to analog-to-digital conversion unit ADC. Communication unit 6 controls data communication with devices external to the system, and inputs data to serial communication unit SCIO or receives data from serial communication unit SCIO. Timer 8 issues an interrupt signal to data processing device 2, in accordance with passage of time which is set by data processing device 2. To data processing device 2, operating power supply voltage Vcc is supplied from the battery which is externally connected to data processing device 2.

In the system having the above-described configuration, the degree of battery degradation (decrease of the electromotive force in the case of the primary battery, decrease of the current supply ability due to decrease of the power storage ability resultant from repeated charging and discharging in the case of the secondary battery) influences the operational stability of data processing device 2.

Power supply circuit 24 lowers or raises externally supplied power supply voltage Vcc to generate internal operating voltage Vdd for example, and supplies the generated voltage to the central processing unit (CPU) for example. A voltage detection unit 10 has power-on reset circuits PORa and PORb generating a reset signal which triggers a power-on reset operation, in response to a voltage change of externally supplied power supply voltage Vcc, and has a low voltage detect circuit LVD generating an interrupt signal or a reset signal in response to a voltage decrease of externally supplied power supply voltage Vcc.

Power-on reset circuit PORa is a voltage detection circuit with low power consumption and low detection accuracy, while power-on reset circuit PORb is a voltage detection circuit with relatively higher power consumption and relatively higher detection accuracy than power-on reset circuit PORa.

When power-on reset circuit PORa detects an increase of externally supplied power supply voltage Vcc to a voltage for example in a range of 2.0 V to 2.5 V (PORa's detection voltage Vrst (PORa)), power-on reset circuit PORa cancels reset signal NPORA or, when power-on reset circuit PORa detects a decrease thereof to this voltage Vrst (PORa), power-on reset circuit PORa outputs reset signal NPORA.

When power-on reset circuit PORb detects an increase of externally supplied power supply voltage Vcc to a voltage for example of 2.6 V±0.1 V (PORb's detection voltage Vrst (PORb)), power-on reset circuit PORb cancels reset signal NPORB or, when power-on reset circuit PORb detects a decrease thereof to this voltage Vrst (PORb), power-on reset circuit PORb outputs reset signal NPORB.

Figure 3:
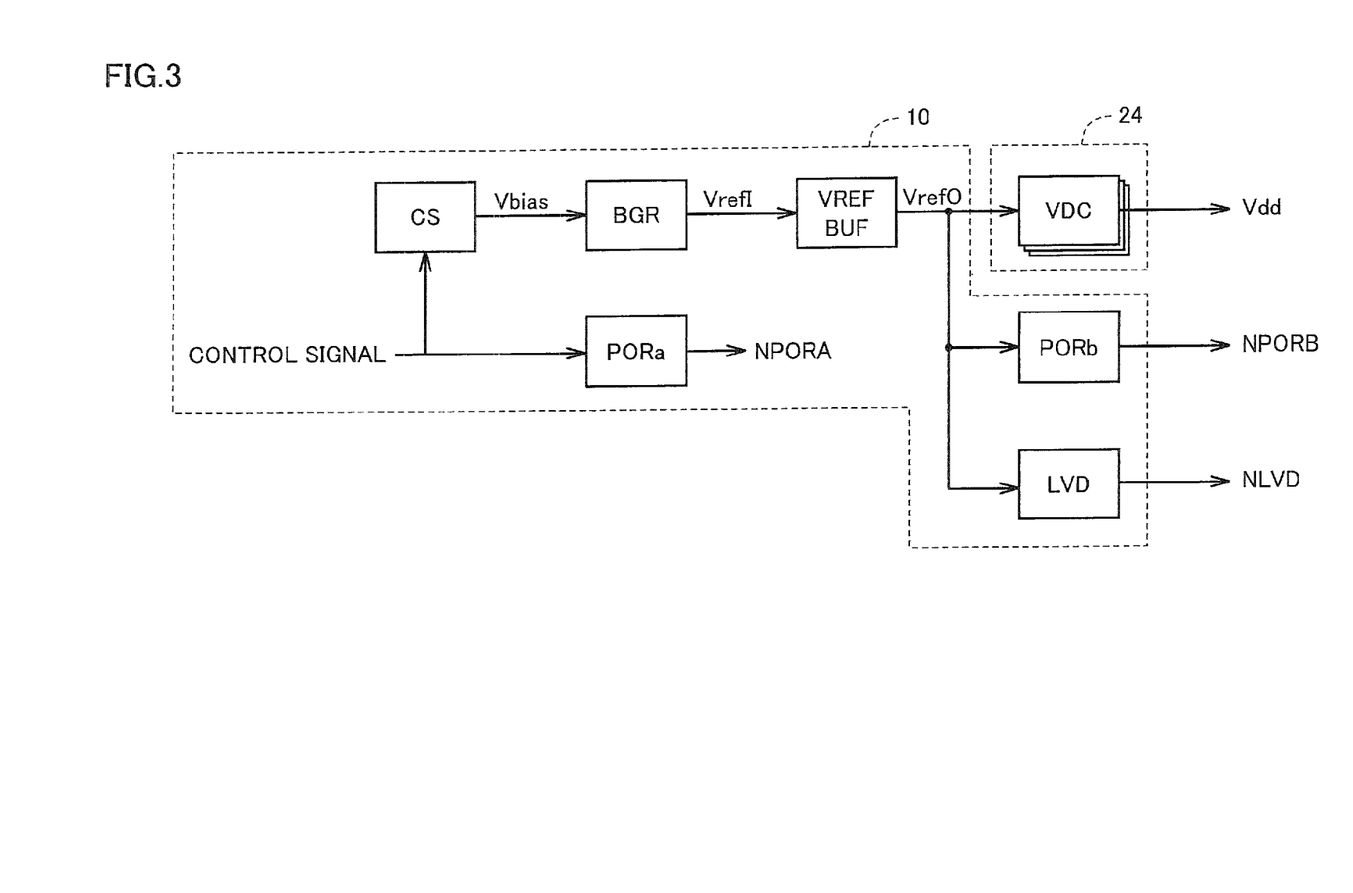
FIG. 3 is a block diagram showing a configuration of a voltage detection unit and a power supply circuit.

FIG. 3 is a block diagram showing a configuration of the voltage detection unit and the power supply circuit.

Referring to FIG. 3, voltage detection unit 10 includes a current source CS, a band gap reference circuit BGR, a reference voltage generation circuit VREFBUF, power-on reset circuits PORa, PORb, and a low voltage detect circuit LVD.

Current source CS is a steady-state current source for generating bias voltage Vbias and is always set in the ON state while data processing device 2 is powered. Band gap reference circuit BGR is a reference voltage generation circuit with low voltage-dependency and low temperature-dependency. Reference voltage generation circuit VREFBUF is a reference voltage generation circuit which performs trimming based on reference voltage VrefI from band gap reference circuit BGR to generate desired reference voltage VrefO.

For data processing device 2, a circuit system can be employed that cuts off supply (stops supply) of the operating power supply voltage to a part or the whole of the internal circuitry upon transition to the standby mode (low power consumption state), to thereby reduce the standby current. For example, in a predetermined low power consumption mode such as software standby mode, supply of the operating power supply voltage to an internal ROM which does not need supply of the operating power supply voltage may be cut off and, in another predetermined low power consumption mode such as deep standby mode, supply of the operating power supply voltage to the whole or a part of internal logic circuits such as CPU may be cut off, in addition of supply of the voltage to the internal ROM. Furthermore, if it is unnecessary to hold data of a RAM, supply of the operating power supply voltage to the RAM may also be cut off.

Power supply circuit 24 includes a plurality of voltage down converters VDCs. Voltage down converter VDC is a circuit generating a power supply voltage for the internal circuitry of the chip, based on the reference voltage from reference voltage generation circuit VREFBUF. In the low power consumption state (deep standby mode), voltage down converter VDC stops operating.

In a normal operation period, power-on reset circuits PORa and PORb are used. In a low power consumption period, stoppage of power-on reset circuit PORb can be selected. This selection is made based on setting of registers in storage unit 28.

In the case where power-on reset circuit PORb and low voltage detect circuit LVD are used, it is necessary that current source CS, band gap reference circuit BGR, and reference voltage generation circuit VREFBUF in FIG. 3 are operating. In contrast, in the case where only power-on reset circuit PORa is used while power-on reset circuit PORb and low voltage detect circuit LVD are not used, it is enough that only current source CS is operating. In a low power consumption period of the standby mode, power-on reset circuit PORb and low voltage detect circuit LVD can be stopped to eliminate the current consumption of power-on reset circuit PORb and low voltage detect circuit LVD. In addition, band gap reference circuit BGR and reference voltage generation circuit VREFBUF can further be stopped to further eliminate the current consumption of band gap reference circuit BGR and reference voltage generation circuit VREFBUF.

Figure 4:
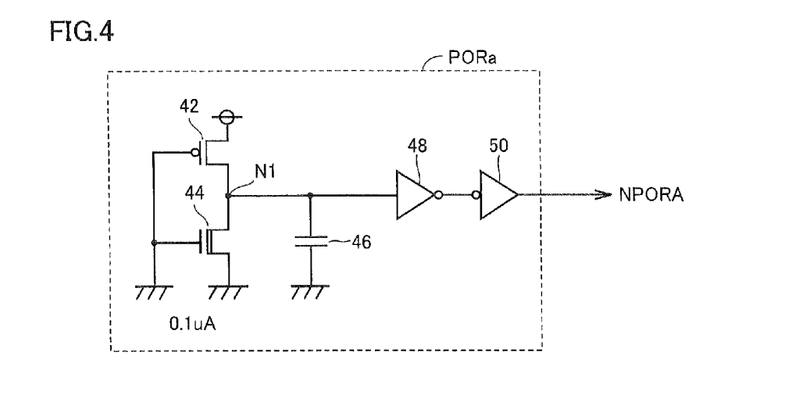
FIG. 4 is a circuit diagram showing an example of a power-on reset circuit PORa.

FIG. 4 is a circuit diagram showing an example of power-on reset circuit PORa.

Figure 5:
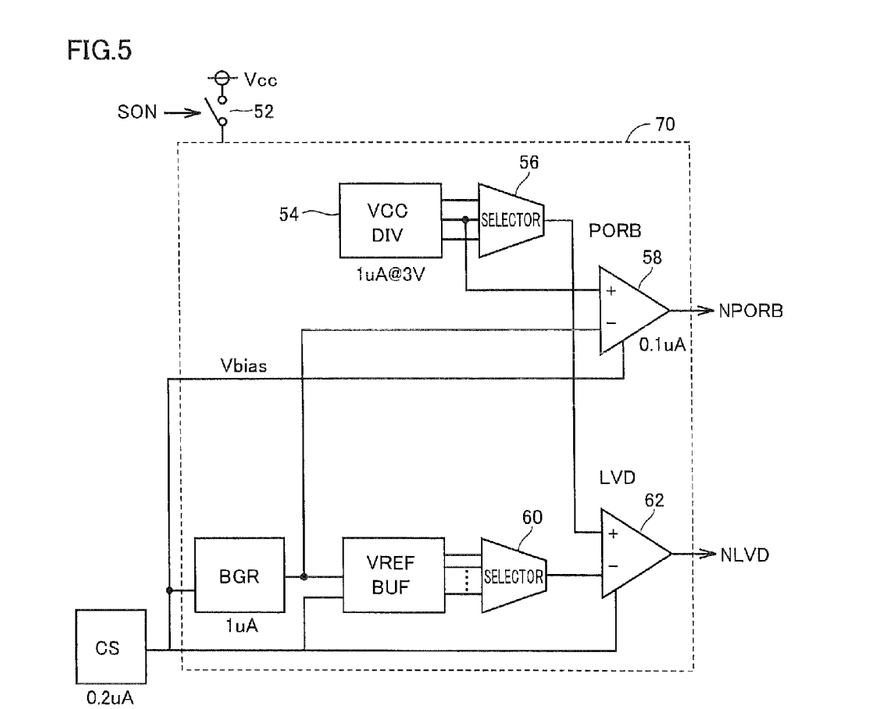
FIG. 5 is a circuit diagram showing an example of a power-on reset circuit PORb and a low voltage detect circuit LVD.

FIG. 5 is a circuit diagram showing an example of power-on reset circuit PORb and low voltage detect circuit LVD.

Referring to FIG. 4, power-on reset circuit PORa includes a P channel MOS transistor 42 connected between a node to which power supply voltage Vcc is supplied and a node N1 and having its gate to which a ground node is connected, a depression-type N channel MOS transistor 44 connected between node N1 and the ground node, and a capacitor 46 connected between node N1 and the ground node.

Power-on reset circuit PORa further includes inverters 48, 50 connected in series to each other, having respective inputs connected to node N1, and outputting reset signal NPORA. Reset signal NPORA represents reset by its low level and represents cancellation of reset by its high level.

Referring to FIG. 5, current source CS, band gap reference circuit BGR, and reference voltage generation circuit VREFBUF are shared by power-on reset circuit PORb and low voltage detect circuit LVD. Voltage Vbias generated by current source CS is supplied to band gap reference circuit BGR, reference voltage generation circuit VREFBUF, and voltage comparators 58, 62.

Voltage comparator 58 has a positive input node receiving an output of a voltage dividing circuit 54, has a negative input node receiving an output of band gap reference circuit BGR, and compares them with each other. Alternatively, as shown in FIG. 3, voltage comparator 58 may be configured to receive the output of reference voltage generation circuit VREFBUF instead of the output of band gap reference circuit BGR.

Voltage comparator 58 outputs reset signal NPORB. Reset signal NPORB represents reset by its low level and represents cancellation of reset by its high level.

A selector 56 selects one of a plurality of voltage fractions generated by and output from voltage dividing circuit 54. A selector 60 selects one of a plurality of outputs from reference voltage generation circuit VREFBUF. The output of selector 56 and the output of selector 60 are input to voltage comparator 62. Voltage comparator 62 has its positive input node receiving the output of selector 56 and has its negative input node receiving the output of selector 60 to compare them with each other. Voltage comparator 62 outputs reset signal NLVD. Reset signal NLVD represents reset by its low level and represents cancellation of reset by its high level.

Figure 6:
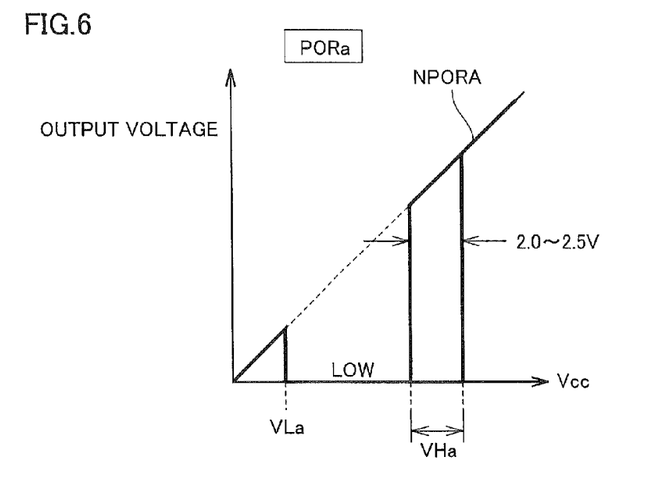
FIG. 6 is a diagram for illustrating output characteristics of power-on reset circuit PORa.

FIG. 6 is a diagram for illustrating output characteristics of power-on reset circuit PORa.

Referring to FIGS. 4 and 6, the threshold voltage of depression-type N channel MOS transistor 44 has a negative value and can therefore be made electrically conductive even when the power supply voltage is 0 V. Thus, when power supply voltage Vcc is 0 V, node N1 is kept at 0 V. Accordingly, node N1 can easily be initialized without using a passive element such as resistor.

After the power supply voltage is supplied, while gate-to-source voltage Vgs of P channel MOS transistor 42 is equal to or lower than the threshold voltage of P channel MOS transistor 42, node N1 is kept at 0 V.

When externally supplied power supply voltage Vcc increases from 0 V to voltage VLa at which inverters 48, 50 can operate, the output of power-on reset circuit PORa is fixed at a low level.

After this, when power supply voltage Vcc increases and the driving ability of transistor 42 becomes larger than the driving ability of transistor 44, the potential of node N1 starts increasing. Then, when the potential of node N1 exceeds the threshold voltage of inverter 48, the output is reversed from the low level to a high level and accordingly reset is cancelled.

This output becomes the high level which represents cancellation of reset, when power supply voltage Vcc is in a range of 2.0 V to 2.5 V. In the current path of transistors 42, 44 in FIG. 4, steady-state current flows to the ground node from the node to which power supply voltage Vcc is supplied. This current is a small value for example of approximately 0.1 μA. This steady-state current is chiefly determined depending on the driving ability of transistor 44.

The dimensions of depression-type N channel MOS transistor 44 can be adjusted to reduce the steady-state current. Moreover, the ratio of the area occupied by transistor 44 to the whole on-chip area is less than that of a resistor, and therefore use of transistor 44 is more advantageous also in terms of the cost.

Regarding power-on reset circuit PORa, however, reset cancellation voltage VHa varies in the range of 2.0 V to 2.5 V. This is for the reason that variation of process parameters causes variation of the threshold voltage of inverter 48 and the balance between respective driving abilities of transistors 42, 44.

Figure 7:
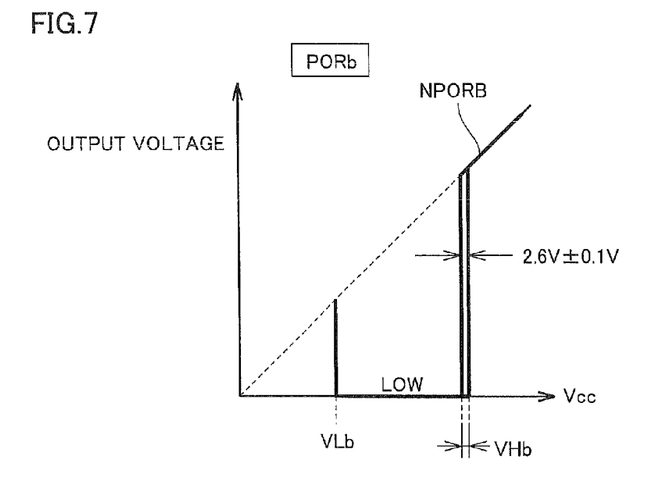
FIG. 7 is a diagram for illustrating output characteristics of power-on reset circuit PORb.

FIG. 7 is a diagram for illustrating output characteristics of power-on reset circuit PORb.

Referring to FIG. 7, when externally supplied power supply voltage Vcc increases from 0 V to voltage VLb, the output of power-on reset circuit PORb is fixed at a low level. This output changes to a high level representing cancellation of reset, when power supply voltage Vcc is 2.6 V±0.1 V. Namely, reset is cancelled when Vcc is in a range of 2.5 V to 2.7 V. In voltage dividing circuit 54, band gap reference circuit BGR, and current source CS in FIG. 5, steady-state currents of 1 μA, 1 μA, and 0.2 μA flow, respectively. Thus, relative to power-on reset circuit PORa, although power-on reset circuit PORb has higher accuracy of the reset cancellation voltage, power-on reset circuit PORb accordingly has large steady-state current.

Regarding power-on reset circuit PORa, as compared with power-on reset circuit PORb, a lower power supply voltage can cause the output of power-on reset circuit PORa to be fixed at the level which effects reset, and therefore required steady-state current is also small. It is therefore desirable to configure the data processing device to take the advantage of power-on reset circuit PORa (reset can be effected by a relatively lower power supply voltage and the steady-state current is smaller) and also take the advantage of power-on reset circuit PORb (the high accuracy of the reset cancellation voltage).

Figure 8:
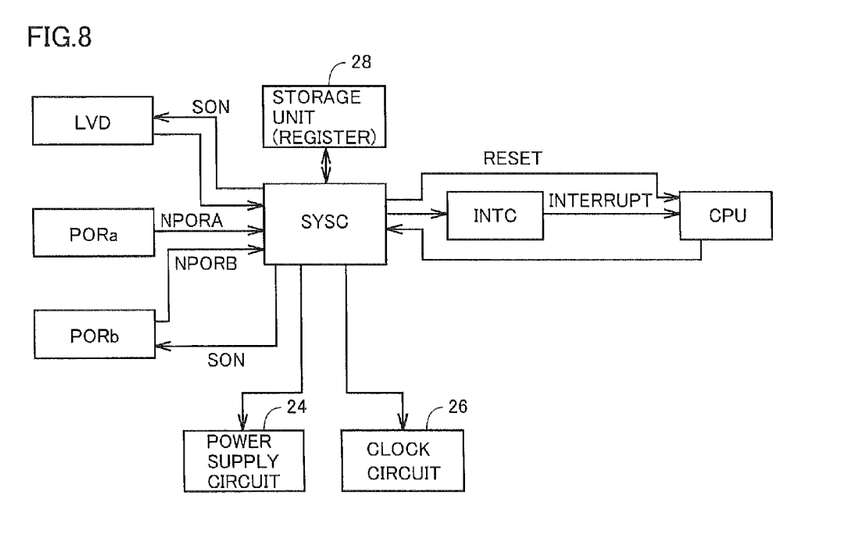
FIG. 8 is a block diagram showing main brocks of the data processing device.

FIG. 8 is a block diagram showing main blocks of the data processing device. This block diagram will be used to explain a switching operation of the data processing device to the standby mode.

Referring to FIG. 8, before executing an instruction to make a transition to the standby mode (low power consumption state), central processing unit CPU makes setting of registers in storage unit 28 so that power-on reset circuit PORb is stopped and only power-on reset circuit PORa operates upon transition to the standby mode (low power consumption state). Then, central processing unit CPU executes the instruction to make a transition to the standby mode (low power consumption state). In response to this, system control unit SYSC refers to the relevant register in storage unit 28 to inactivate control signal SON and thereby stop low voltage detect circuit LVD and power-on reset circuit PORb. As a result, in the standby mode (low power consumption state), it is only power-on reset circuit PORa that continues operating, among the components in voltage detection unit 10.

Likewise, system control unit SYSC also refers to the setting of the relevant register in storage unit 28 to instruct power supply circuit 24 and clock circuit 26 to stop supplying the power supply voltage and to stop supplying the clock to central processing unit CPU, data transfer unit DMAC, the memory, analogue-to-digital conversion unit ADC, and serial communication unit SCIO.

It should be noted that, since central processing unit CPU makes setting of the register before transition to the standby state, a user may change the program to appropriately change the state of power consumption in the standby state.

FIG. 8 illustrates the example where system control unit SYSC is configured to be able to operate with a lower voltage than central processing unit CPU and controls recovery from the standby mode (lower power consumption state). Alternatively, a control unit which is operable with such a low voltage may be provided in power supply circuit 24.

Figure 9:
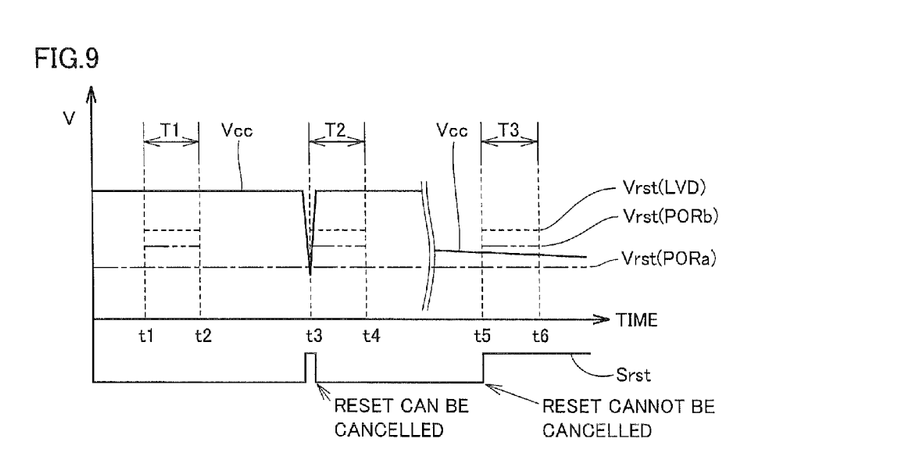
FIG. 9 is an operation waveform chart for illustrating a low power consumption period and an operation period.

FIG. 9 is an operation waveform chart for illustrating a low power consumption period and an operation period.

Referring to FIGS. 8 and 9, in the standby mode (low power consumption state) before time t1, while power supply voltage Vcc which is externally supplied from the battery is higher than detection voltage Vrst (PORa) of power-on reset circuit PORa, power-on reset circuit PORa continues monitoring the voltage level of the externally supplied voltage.

At time t1, in the case where data processing device 2 recovers from the standby mode (low power consumption state) in response to a signal from sensor 4 for example in FIG. 1 connected to the data processing device 2, power-on reset circuit PORb also resumes its operation. Namely, even if an instruction to stop power-on reset circuit PORb is written in a relevant register of storage unit 28 before transition to the standby mode (low power consumption state), the register is cleared in response to output of reset signal NPORA and, in response to this, system control unit SYSC activates signal SON and accordingly power-on reset circuit PORb starts operating.

At this time, if externally supplied power supply voltage Vcc is higher than detection voltage Vrst (PORb), data processing device 2 can recover from the standby mode (low power consumption state) to perform processing on an externally input signal (operation period T1).

At the time like time t5, however, if externally supplied power supply voltage Vcc has decreased below detection voltage Vrst (PORb) at the time when power-on reset circuit PORb resumes its operation, power-on reset circuit PORb outputs the reset signal (operation period T3). At this time, system control unit SYSC does not cancel reset. Accordingly, the accuracy of the reset cancellation voltage is maintained.

At the time like time t3, if externally supplied power supply voltage Vcc decreases below detection voltage Vrst (PORa) during the standby mode (during low power consumption state), power-on reset circuit PORa outputs reset signal NPORA. In response to output of reset signal NPORA or NPORB from power-on reset circuit PORa or power-on reset circuit PORb, data processing device 2 initializes the memory and register as well as other circuits including a latch circuit in a hardware manner (namely by system control unit SYSC, not by software reset of the CPU), and waits for cancellation of the reset signal. At this time, even if an instruction to stop is written in a relevant register of storage unit 28 before transition to the standby mode (low power consumption state), power-on reset circuit PORb starts operating since the register is cleared in response to output of reset signal NPORA.

It should be noted that, system control unit SYSC is configured so that the lower limit of the operating power supply voltage is lower than that of central processing unit CPU, and therefore can perform processing for activating power-on reset circuit PORb in response to output of the reset signal of power-on reset circuit PORa.

At the time like time t3, in the case where externally supplied power supply voltage Vcc supplied from the battery returns to a state higher than detection voltage Vrst (PORa) immediately after the reset signal is output, power-on reset circuit PORa can output the reset cancellation signal. Furthermore, in the case where externally supplied voltage Vcc returns to a state higher than detection voltage Vrst (PORb), power-on reset circuit PORb can also output the reset cancellation signal. Accordingly, reset of data processing device 2 is cancelled and data processing device 2 can thus be rebooted.

At the time like time t3, when a temporary decrease of the voltage occurs, an unexpected value is set at a latch circuit for example in the circuitry of data processing device 2. The decrease of externally supplied power supply voltage Vcc can be detected to perform the reset operation and thereby prevent the operation of data processing device 2 from becoming unstable.

In contrast, at the time like time t5, when data processing device 2 recovers from the standby mode (low power consumption state) in response to an externally input signal or output of the reset signal and externally supplied power supply voltage Vcc at this time is lower than detection voltage Vrst (PORb) or further lower than detection voltage Vrst (PORa), one of or both power-on reset circuit PORa and power-on reset circuit PORb cannot output the reset cancellation signal. Since system control unit SYSC does not cancel reset, data processing device 2 continues stopping without cancellation of the reset (operation period T3).

Figure 10:
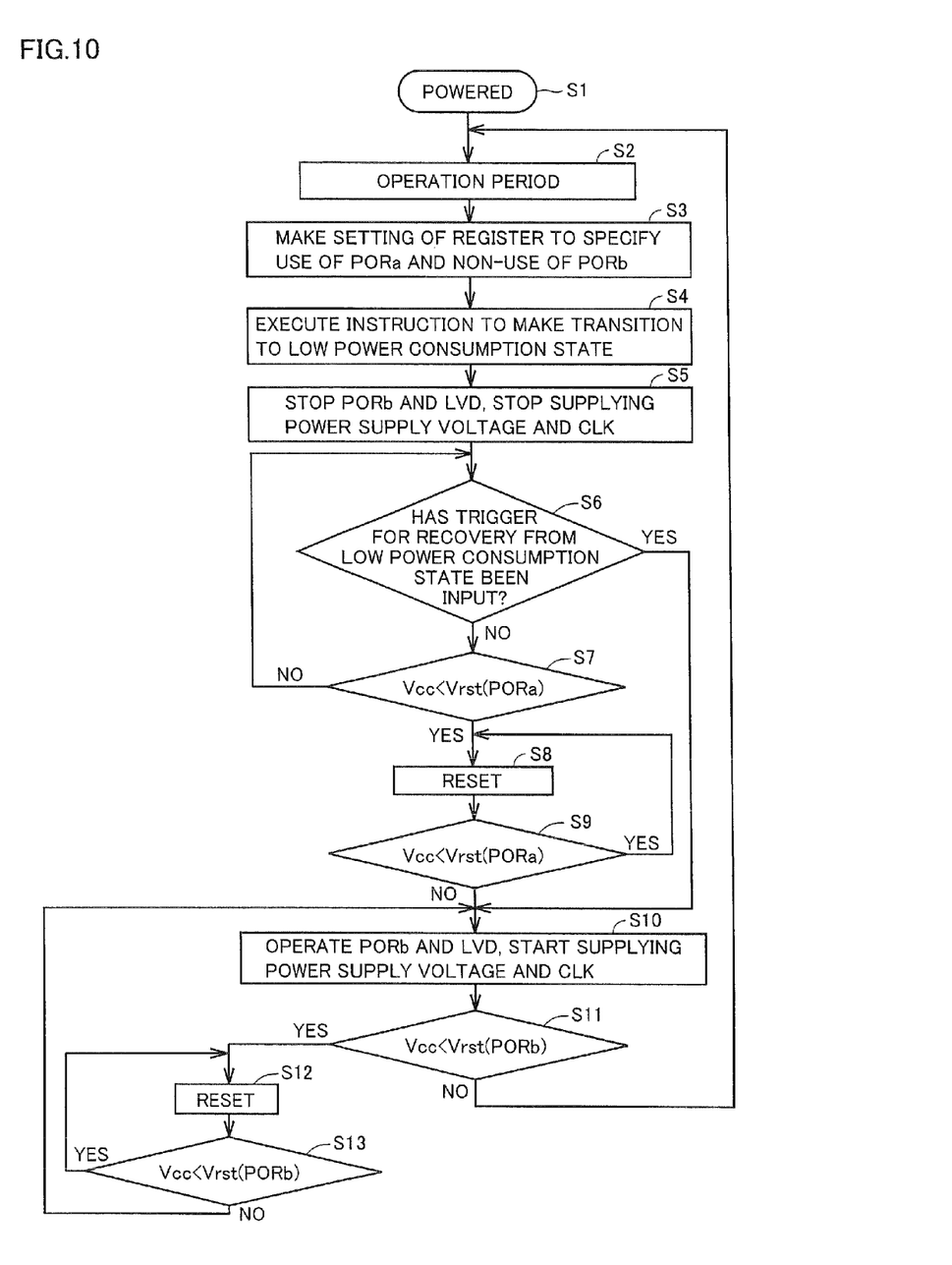
FIG. 10 is a flowchart for illustrating a process regarding a power-on reset operation performed by the data processing device.

FIG. 10 is a flowchart for illustrating a process regarding a power-on reset operation performed by the data processing device.

Referring to FIG. 10, the data processing device is normally powered in step S1. In response to this, the data processing device performs the power-on reset operation and thereafter enters an operation period in step S2. The power-on reset operation at this time is carried out while both power-on reset circuit PORa and power-on reset circuit PORb are activated.

In step S2, data processing device 2 performs a data processing operation in a normal mode in which the power-on reset is cancelled. This processing is processing of a control program to be performed in this period as essential processing of the system. For example, in the case of the electricity meter, this processing is recording of the amount of power consumption which is performed every 24 hours. In the operation period of step S2, central processing unit CPU and other peripheral circuits are started as required to operate.

When the operation in step S2 is completed, data processing device 2 switches from the normal mode to the standby mode of the low power consumption state. In step S3, before switch to the standby mode, central processing unit CPU makes setting of registers in storage unit 28 so that only power-on reset circuit PORa is used while power-on reset circuit PORb is not used. In addition, as required, setting for stopping low voltage detect circuit LVD, power supply circuit 24, and clock circuit 26 is also written in the relevant register in storage unit 28.

After this, in step S4, central processing unit CPU executes an instruction to make transition to the standby mode of the low power consumption state. In step S5, system control unit SYSC refers to the setting of the register in storage unit 28 and accordingly stops power-on reset circuit PORb and low voltage detect circuit LVD and also stops power supply circuit 24 and clock circuit 26. Thus, power-on reset circuit PORb and low voltage detect circuit LVD are stopped to further reduce the power consumption in the standby mode as compared with the conventional system.

In step S6, system control unit SYSC waits for input of a trigger for recovery from the standby mode (low power consumption state). The trigger for recovery from the standby mode (low power consumption state) may be a request to recover provided from communication unit 6 in FIG. 1, interruption by timer 8, or the like. In step S6, when the trigger for recovery is input, the process proceeds to step S10. When the trigger for recovery is not input, the process proceeds to step S7.

In step S7, it is determined whether or not externally supplied power supply voltage Vcc is lower than detection voltage Vrst (PORa) of power-on reset circuit PORa. Specifically, system control unit SYSC makes this determination based on whether output NPORA of power-on reset circuit PORa is the L level or not. In step S7, in the case where externally supplied power supply voltage Vcc, has not decreased below detection voltage Vrst (PORa), the process returns to step S6 in which detection of whether or not a trigger for recovery is input is continued.

In step S7, in the case where the decrease of externally supplied power supply voltage Vcc is detected, reset is executed in step S8, the setting of the register in storage unit 28 is cleared, and the process proceeds to step S9. In step S9, like step S7, it is determined whether or not externally supplied power supply voltage Vcc is lower than detection voltage Vrst (PORa) of power-on reset circuit PORa.

In step S9, in the case where externally supplied power supply voltage Vcc has not decreased below detection voltage Vrst (PORa) (in the case where the voltage has increased), the process proceeds to step S10. In contrast, in the case where externally supplied power supply voltage Vcc is still lower than detection voltage Vrst (PORa) in step S9, the process returns again to step S8 and reset is continued.

In step S10, system control unit SYSC activates control signal SON in FIG. 5 to turn on switch 52 and cause the power supply voltage to be supplied to circuit 70. Accordingly, power-on reset circuit PORb and low voltage detect circuit LVD start operating. Furthermore, the power supply circuit and the clock circuit are also activated to start supplying the power supply voltage and the clock signal.

Subsequently, in step S11, it is determined whether or not externally supplied power supply voltage Vcc is lower than detection voltage Vrst (PORb) of power-on reset circuit PORb. Specifically, system control unit SYSC makes this determination based on whether or not output NPORB of power-on reset circuit PORb is the L level.

In step S11, in the case where externally supplied power supply voltage Vcc is lower than detection voltage Vrst (PORb) of power-on reset circuit PORb, reset is executed in step S12, the setting of the register in storage unit 28 is cleared, and the process proceeds to step S13. In step S13, like step S11, it is determined whether or not externally supplied power supply voltage Vcc is lower than detection voltage Vrst (PORb) of power-on reset circuit PORb.

In step S13, in the case where externally supplied power supply voltage Vcc is lower than detection voltage Vrst (PORb) of power-on reset circuit PORb, step S12 is performed again and cancellation of reset is waited for. If externally supplied power supply voltage Vcc continues being lower than detection voltage Vrst (PORb) of power-on reset circuit PORb, reset is not cancelled as seen in period T3 of FIG. 9.

In step S13, in the case where externally supplied power supply voltage Vcc has increased to be higher than detection voltage Vrst (PORb) of power-on reset circuit PORb, reset is cancelled and the process returns to step S10.

In step S10, power-on reset circuit PORb and low voltage detect circuit LVD start operating, and the power supply circuit and the clock circuit are also activated to start supplying the power supply voltage and the clock signal. After this, in step S11, in the case where externally supplied power supply voltage Vcc has not decreased below detection voltage Vrst (PORb) of power-on reset circuit PORb, the process proceeds to step S2 in which processing in the operation period of the data processing device is performed.

The processing from step S9 to step S13 may be performed as a part of the processing for powering (step S1). In this case, if externally supplied power supply voltage Vcc is lower than detection voltage Vrst (PORa) of power-on reset circuit PORa in step S9, the time is waited for at which externally supplied voltage Vcc increases (step S9 is continued).

With the above-described configuration, the amount of current necessary in the period in which the data processing device is in the standby mode (low power consumption state) can be reduced. Accordingly, degradation of the current supply ability of the battery which supplies an externally supplied voltage to the data processing device can be lessened and consequently extension of the operating time of the system as a whole can be achieved.

In addition, the power consumption of the whole system can also be reduced even if the power supply voltage is supplied not from the battery but from a commercial power supply without decrease of its current supply ability.

Finally, referring again to the drawings, an overview of the data processing device of the present embodiment will be provided. As shown in FIGS. 2 and 8, data processing device 2 includes: first power-on reset circuit PORa shown in FIG. 4; second power-on reset circuit PORb shown in FIG. 5 with higher power consumption and higher reset voltage accuracy than the first power-on reset circuit; storage unit 28 storing information for determining whether to keep second power-on reset circuit PORb in an active state or an inactive state; and central processing unit CPU initialized in response to respective outputs of first and second power-on reset circuits PORa, PORb and setting the information in the storage unit 28.

Preferably, data processing device 2 has a normal mode and a standby mode. Central processing unit CPU sets the information in storage unit 28 so that, in the standby mode, second power-on reset circuit PORb is inactivated while first power-on reset circuit PORa is used to detect that a power supply voltage has decreased to a voltage which meets a reset condition.

More preferably, prior to switch from the normal mode to the standby mode, central processing unit CPU sets the information in storage unit 28 so that second power-on reset circuit PORb is inactivated, and thereafter switches to the standby mode.

Still more preferably, as shown in FIG. 8, data processing device 2 further includes system control unit SYSC receiving respective outputs of first and second power-on reset circuits PORa, PORb. As described with reference to FIG. 10, in a case where the output of first power-on reset circuit PORa indicates reset and thereafter indicates cancellation of reset (NO in step S9) and second power-on reset circuit PORb is inactivated in the standby mode, system control unit SYSC activates second power-on reset circuit PORb (step S10) and, when the output of second power-on reset circuit PORb indicates cancellation of reset (NO in step S13 and NO in step S11), system control unit SYSC cancels reset of central processing unit CPU.

Preferably, data processing device 2 has a normal mode and a standby mode. Central processing unit CPU can select one of use and non-use of second power-on reset circuit PORb in the standby mode, by setting the information in storage unit 28 before switching from the normal mode to the standby mode. Namely, while an example has been described in connection with the embodiment where second power-on reset circuit PORb is not used during the standby mode, a program executed by central processing unit CPU can be changed to thereby change the operation so that second power-on reset circuit PORb is also used during the standby mode.

Preferably, as shown in FIG. 4, first power-on reset circuit PORa includes inverter 48 having an input to which connected internal node N1 charged to have an increased potential as potential of a power supply node increases. As shown in FIG. 5, second power-on reset circuit PORb includes comparison circuit 58 comparing an output of band gap reference circuit BGR with an output of voltage dividing circuit 54 dividing a voltage of the power supply node.

It should be construed that embodiments disclosed herein are by way of illustration in all respects, not by way of limitation. It is intended that the scope of the present invention is defined by claims, not by the description above, and encompasses all modifications and variations equivalent in meaning and scope to the claims.

REFERENCE SIGNS LIST 1 data processing system; 2 data processing device; 4 sensor; 6 communication unit; 8 timer; 10 voltage detection unit; 12 battery; 18 printed circuit board; 21 bus; 22 memory; 24 power supply circuit; 26 clock circuit; 28 storage unit; 42, 44 transistor; 46 capacitor; 48, 50 inverter; 52 switch; 54 voltage dividing circuit; 56, 60 selector; 58, 62 voltage comparator; 70 circuit; ADC analog-to-digital conversion unit; BGR band gap reference circuit; CPU central processing unit; CS current source; DMAC data transfer unit; INTC interrupt controller; LVD low voltage detect circuit; PORa, PORb power-on reset circuit; SCIO serial communication unit; SYSC system control unit; VDC voltage down converter circuit; VREFBUF reference voltage generation circuit

The invention claimed is:

1. A data processing device, comprising:
a first power-on reset circuit;
a second power-on reset circuit with a higher power consumption and a higher reset voltage accuracy than said first power-on reset circuit;
a low voltage detect circuit;
a storage unit storing information for determining whether to keep said second power-on reset circuit and said low voltage detect circuit in an active state or an inactive state;
a central processing unit initialized in a response to respective outputs of said first and second power-on reset circuits and setting said information in said storage unit; and
a power supply node providing a power to the data processing device,
wherein said first power-on reset circuit includes an internal node that is charged to have a variable potential as a potential of the power supply node changes,
wherein the data processing device is configured to select one of a first operation and a second operation in a standby mode,
wherein, in the first operation, said first power-on reset circuit with a lower reset voltage is enabled, while said low voltage detect circuit and said second power-on reset circuit is enabled, and
wherein, in the second operation, said first power-on reset circuit with the lower reset voltage is enabled, while said low voltage detect circuit and said second power-on reset circuit is disabled.

2. The data processing device according to claim 1, wherein said data processing device has a normal mode and said standby mode, and wherein said central processing unit sets said information in said storage unit so that, in said standby mode, said second power-on reset circuit and said low voltage detect circuit are inactivated while said first power-on reset circuit is used to detect that a power supply voltage has decreased to a voltage which meets a reset condition.

3. The data processing device according to claim 2, wherein, prior to switch from said normal mode to said standby mode, said central processing unit sets said information in said storage unit so that said second power-on reset circuit and said low voltage detect circuit are inactivated, and thereafter switches to said standby mode.

4. The data processing device according to claim 3, further comprising a control unit receiving respective outputs of said first and second power-on reset circuits,
wherein, in a case where the output of said first power-on reset circuit indicates a reset and thereafter indicates cancellation of the reset and said second power-on reset circuit is inactivated in said standby mode, said control unit activates said second power-on reset circuit and, when the output of said second power-on reset circuit indicates cancellation of the reset, said control unit cancels a reset of said central processing unit.

5. The data processing device according to claim 1, wherein said data processing device has a normal mode and said standby mode, and
wherein said central processing unit is configured to select one of use and non-use of said second power-on reset circuit in said standby mode, by setting said information in said storage unit before switching from said normal mode to said standby mode.

6. The data processing device according to claim 1, wherein said first power-on reset circuit further includes an inverter having an input to which is connected to the internal node charged to have an increased potential as the potential of the power supply node increases, and
wherein said second power-on reset circuit includes a comparison circuit comparing an output of a band gap reference circuit with an output of a voltage dividing circuit dividing a voltage of the power supply node.

7. The data processing device according to claim 1, wherein the internal node is charged to have an increased potential as the potential of the power supply node increases.

8. The data processing device according to claim 1, wherein said first power-on reset circuit further includes an inverter having an input connected to the internal node.

9. The data processing device according to claim 8, wherein the internal node is charged to have an increased potential as the potential of the power supply node increases.

10. The data processing device according to claim 9, wherein said second power-on reset circuit includes:
a voltage dividing circuit dividing a voltage of the power supply node; and
a comparison circuit that received a divided voltage of the voltage dividing circuit.

11. The data processing device according to claim 1, wherein said second power-on reset circuit includes a comparison circuit comparing an output of a band gap reference circuit with an output of a voltage dividing circuit dividing a voltage of the power supply node.

12. A data processing system, comprising:
a printed circuit board; and
a data processing device mounted on said printed circuit board,
said data processing device including:
a first power-on reset circuit;
a second power-on reset circuit with higher power consumption and higher reset voltage accuracy than said first power-on reset circuit;
a low voltage detect circuit;
a storage unit storing information for determining whether to keep said second power-on reset circuit and said low voltage detect circuit in an active state or an inactive state;
a central processing unit initialized in a response to respective outputs of said first and second power-on reset circuits and setting said information in said storage unit; and
a power supply node providing a power to the data processing device,
wherein said first power-on reset circuit includes an internal node that is charged to have a variable potential as a potential of the power supply node changes~
wherein said data processing device is configured to select one of a first operation and a second operation in a standby mode,
wherein, in the first operation, said first power-on reset circuit with a lower reset voltage is enabled, while said low voltage detect circuit and said second power-on reset circuit is enabled, and
wherein, in the second operation, said first power-on reset circuit with the lower reset voltage is enabled, while said low voltage detect circuit and said second power-on reset circuit is disabled.

13. The data processing system according to claim 12, wherein the internal node is charged to have an increased potential as the potential of the power supply node increases.

14. The data processing system according to claim 13, wherein said first power-on reset circuit further includes an inverter having an input connected to the internal node.

15. The data processing system according to claim 12, wherein said first power-on reset circuit further includes an inverter having an input connected to the internal node.

16. The data processing system according to claim 15, wherein said second power-on reset circuit includes a voltage dividing circuit dividing a voltage of the power supply node.

17. The data processing system according to claim 16, wherein said second power-on reset circuit further includes a comparison circuit that receives a divided voltage of the voltage dividing circuit.

18. The data processing system according to claim 12, wherein said second power-on reset circuit includes a comparison circuit comparing an output of a band gap reference circuit with an output of a voltage dividing circuit dividing a voltage of the power supply node.

19. The data processing system according to claim 18, wherein said first power-on reset circuit further includes an inverter having an input to which is connected the internal node charged to have an increased potential as the potential of the power supply node increases.

* * * * *